(12) United States Patent
Kiriyama (10) Patent No.: US 6,953,989 B2
(45) Date of Patent: Oct. 11, 2005

(54) FILM CARRIER TAPE FOR MOUNTING ELECTRONIC DEVICES THEREON AND FINAL DEFECT MARKING METHOD USING THE SAME

(75) Inventor: Tatsuya Kiriyama, Shimonoseki (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 10/766,390

(22) Filed: Jan. 28, 2004

(65) Prior Publication Data

US 2004/0256701 A1 Dec. 23, 2004

(30) Foreign Application Priority Data

Jan. 28, 2003  (JP) ........................................ 2003-019018

(51) Int. Cl.$^7$ ............................................. H01L 23/495
(52) U.S. Cl. .................... 257/668; 257/48; 257/666; 257/691; 257/694; 257/737
(58) Field of Search ........................ 257/48, 666, 691, 257/694, 737

(56) References Cited

U.S. PATENT DOCUMENTS 5,334,858 A * 8/1994 Wada ........................... 257/48

FOREIGN PATENT DOCUMENTS

| JP | 06-174774 A | 6/1994 |
| JP | 07-110863 A | 4/1995 |

* cited by examiner

*Primary Examiner*—David Nelms
*Assistant Examiner*—Mai-Huong Tran
(74) *Attorney, Agent, or Firm*—The Webb Law Firm, P.C.

(57) ABSTRACT

A film carrier tape for mounting electronic devices thereon having a mounting unit in which a wiring pattern is formed by etching on a base material, wherein the mounting unit has a target mark to be a reference of an alignment for carrying out final defect marking in a target position on the mounting unit by marking means as a pattern formed on the base material by the etching, and a defect marking method using the same are provided.

16 Claims, 7 Drawing Sheets

FILM CARRIER TAPE FOR MOUNTING ELECTRONIC DEVICES THEREON AND FINAL DEFECT MARKING METHOD USING THE SAME

FIELD OF THE INVENTION

The present invention relates to a film carrier tape for mounting electronic devices thereon capable of correctly giving a defect display (mark) with high precision in a target position on a mounting unit based on a result obtained by a quality inspection such as a visual inspection or an electrical inspection of the film carrier tape (including a TAB (Tape Automated Bonding) tape, a TBGA (Tape Ball Grid Array) tape, a CSP (Chip Size Package) tape, an ASIC (Application Specific Integrated Circuit) tape and a COF (Chip on Film) tape, the film carrier tape having the mark given thereto, and a defect marking method of the film carrier tape.

BACKGROUND OF THE INVENTION

With the development of electronics industries, a demand for a printed wiring board for mounting electronic devices such as an IC (integrated circuit) or an LSI (large scale integrated circuit) has suddenly increased and a reduction in the size and weight and an increase in the function of an electronic equipment have been required. As a method of mounting electronic devices which meets these requirements, there has recently been employed a mounting method using a film carrier tape such as a TAB tape, a T-BGA tape and an ASIC tape. In particular, the importance has been increased in the electronic industries which use a liquid crystal display (LCD) requiring an enhancement in fineness, a reduction in thickness and a decrease in the frame area of a liquid crystal screen as in a personal computer or the like.

Figure 6:
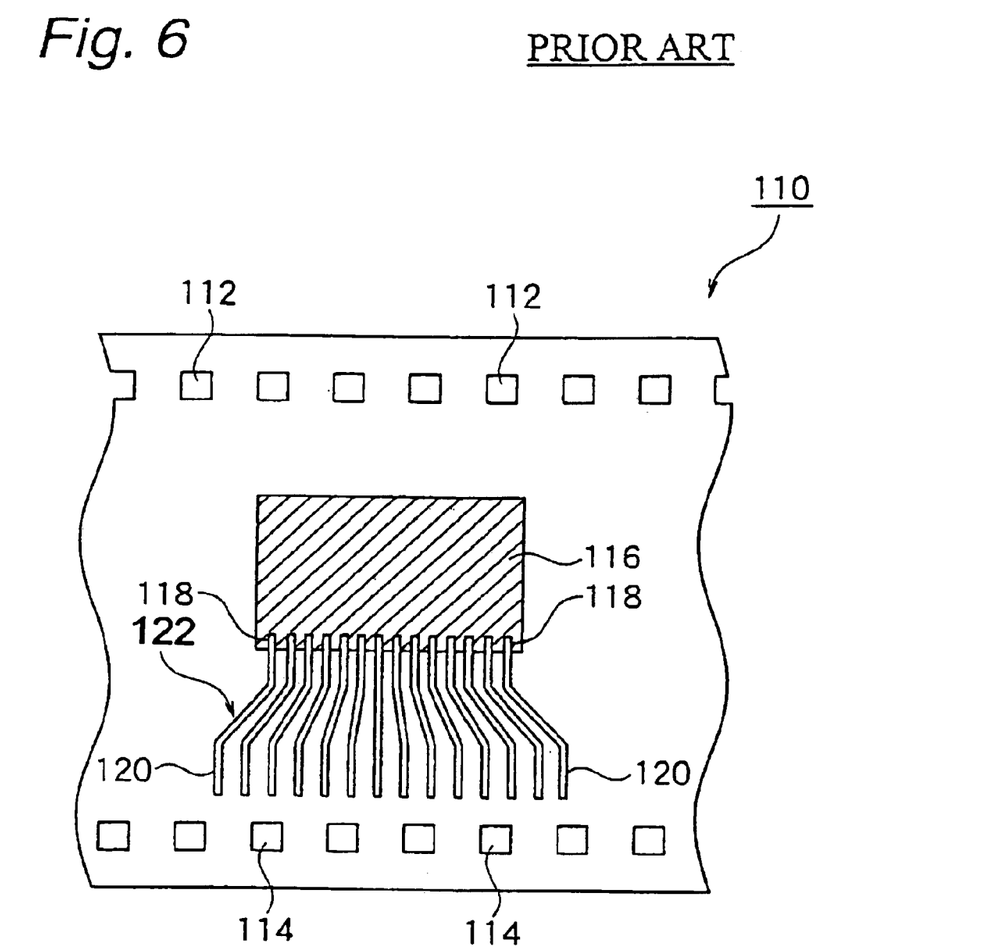
FIG. 6 is a partial top view showing a conventional TAB tape.

FIG. 6 shows an example of the structure of the TAB tape which has conventionally been used generally. A TAB tape 110 has a plurality of sprocket holes 112 and 114 for conveyance of the tape arranged continuously in a longitudinal direction on both side ends in a transverse direction respectively and a device hole 116 for attaching a device such as an IC is formed in an almost central portion between the sprocket holes 112 and 114 There is formed a wiring pattern 122 in which an inner lead 118 in the device hole 116 and an outer lead 120 are connected to each other.

The TAB tape is usually manufactured in the following manner. A copper foil is laminated, to a base material film such as a polyimide film having an adhesive applied onto a surface of the base material film. Then the surface of the copper foil is coated with a photoresist. For the photoresist surface, a portion other than a copper wiring pattern to be formed is exposed and the exposed photoresist is removed. Next, a copper foil in the portion from which the photoresist has been removed is removed by etching, and furthermore, the photoresist is removed so that the copper wiring pattern is formed. Alternatively, the copper wiring pattern portion to be formed is exposed and a photoresist which is not exposed is removed from a resist surface depending on the type of the photoresist to be used. Then, the copper foil in the portion in which the photoresist has been removed is removed by the etching, and furthermore, the photoresist is removed so that the copper wiring pattern is formed.

A solder resist to be a protective layer for a circuit is applied onto a tape on which the wiring pattern is thus formed excluding the connecting portion of the inner lead and the like. After the applied solder resist is cured, a plated layer such as tin is formed on the connecting terminal portion.

After such a manufacturing process is carried out, a quality inspection for a wiring pattern defect or the like is executed for each mounting unit arranged on the TAB tape. More specifically, for example, there has been executed a human visual inspection (a transmitted light inspection or the like), a method described in Japanese Laid-Open Patent Publication No. 6-174774 for electrically inspecting an electrical disconnection of a wiring pattern, a short circuit and an insulation resistance, or the like.

As a result of the quality inspection, a defect mark is given to a mounting unit determined to be defective. Examples of a marking method of giving a defect mark include a method of forming a punching hole on a defective unit or a method of carrying out ink marking over a defective unit by means of a stamp member. The position of the defect marking is varied for each product.

The TAB tape over which the defect marking is thus carried out is shipped in such a state that it is wound upon a reel. At this time, a series of mounting units arranged on the TAB tape include a large number of normal pattern units and a few defective units (over which the marking is carried out).

On the other hand, recently, there have also been used tapes having no device hole, for example, a TAB tape for connecting an IC substrate, or the like with a solder ball through a hole opened on the TAB tape in place of an outer lead which is referred to as a BGA (Ball Grid Array) and a TAB tape including a package having the same size as the size of an IC and mainly having the same connecting method as that of the BGA which is referred to as a CSP (Chip Size Package) in addition to the TAB tape shown in FIG. 6.

Moreover, a mounting technique referred to as a COF (Chip on Film) has also been used as an effective technique for an increase in the density of a wiring pitch. The COF uses a two-layer tape having a polyimide layer and a copper foil provided without an adhesive layer which is manufactured by a casting method of coating an electrodeposited copper foil with a polyimide material and performing a heat treatment to form a polyimide film having a copper foil, or a plating method of forming a copper foil on the polyimide film by electrolytic plating.

Figure 7:
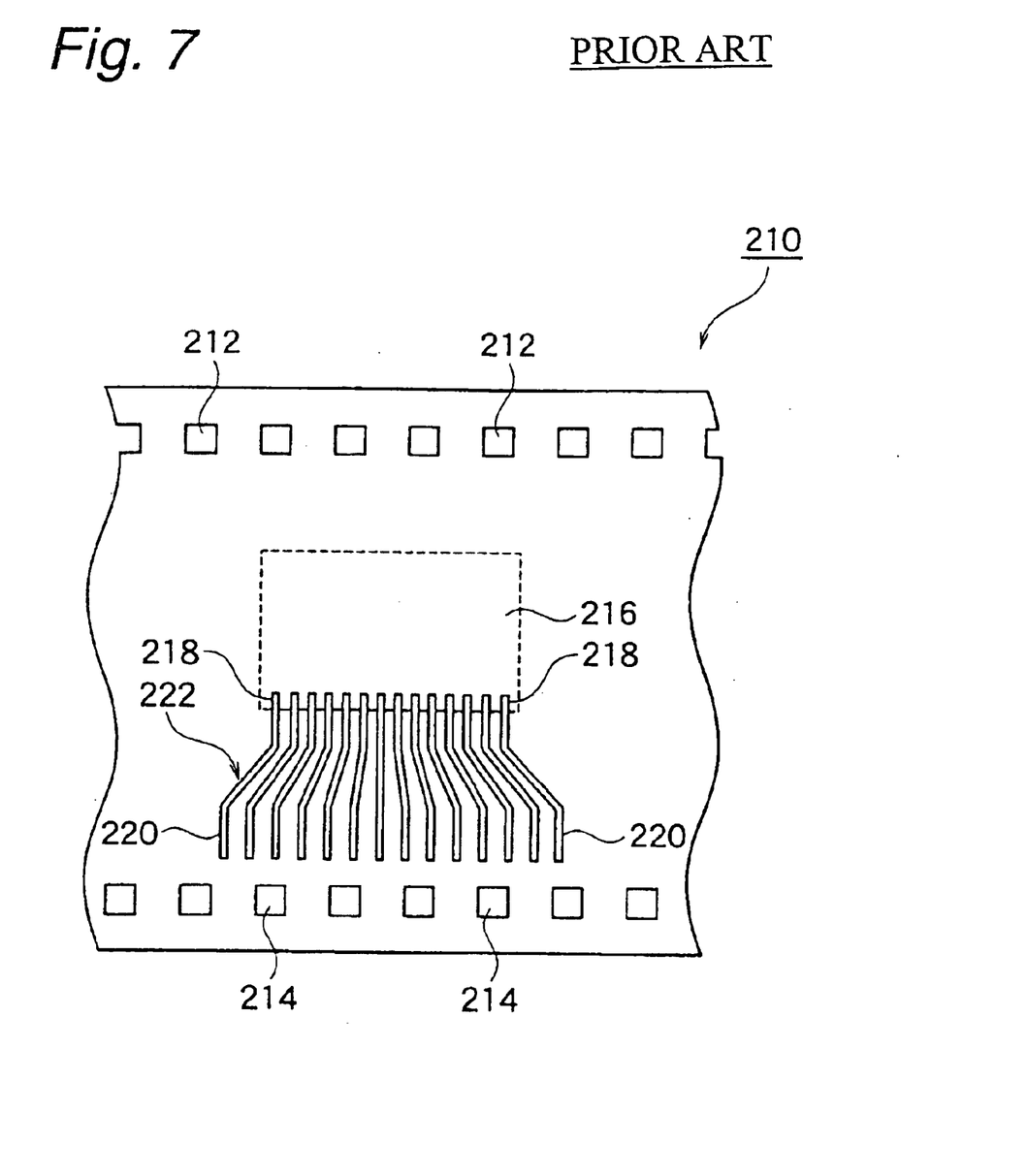
FIG. 7 is a partial top view showing a conventional COF tape.

FIG. 7 shows an example of the structure of a conventional COF tape. A COF tape 210 has a plurality of sprocket holes 212 and 214 for conveyance of the tape arranged continuously in a longitudinal direction on both side ends in a transverse direction respectively and a device such as an IC is mounted to an almost central portion 216 between the sprocket holes 212 and 214, for example. There is formed a wiring pattern 222 in which an inner lead 218 and an outer lead 220 on the film are connected to each other.

The COF tape is excellent in a heat resistance or the like in an IC mounting processing and has such a structure that a device hole is not formed but an inner lead is held by the film, and the IC is mounted on the film (not on the device hole).

Referring to these kinds of film carrier tapes for mounting electronic devices thereon, similarly, a manufacturing process for the formation of a wiring pattern or the like is carried out and a quality inspection is then performed for a wiring pattern defect on the film carrier tape or the like. More specifically, for example, there has been carried out a human visual inspection or a method described in Japanese Laid-Open Patent Publication No. 7-110863 in which the image of a wiring pattern formed on the COF tape is picked up by using a CCD camera referred to as a line sensor camera and image pick-up information thus obtained is compared with prestored data on the master pattern of a good product to inspect the defect of the wiring pattern.

As a result of the quality inspection, a defect mark is given to a mounting unit determined to be defective and the film carrier tape over which a defect display is carried out is wound upon a reel and is shipped in this condition.

The defect marking is to be carried out in a predetermined shape in a predetermined portion specified by a user of an electrical manufacturer according to the specification of the user who mounts a device such as an IC on the film carrier tape. More specifically, the film carrier tape is shipped to the user in such a state as to include a few defective units (which are marked) together with a large number of normal mounting units arranged on the tape as described above. When the user is to mount devices such as the IC on mounting units in the film carrier tape, there is an inconvenience that a mounting unit is not normally recognized to be a defective product but is mounted if a mark for defective recognition is not placed in a constant position.

In the film carrier tape for mounting electronic devices thereon!provided with a predetermined hole such as a device hole shown in FIG. 6 which has conventionally been used widely, an alignment is carried out by setting the device hole to be a reference of viewing when the defect marking is to be carried out. For example, a larger punching hole than the device hole 116 is formed in a position including the device hole 116 in FIG. 6. Thus, the alignment is simple and the defect marking can easily be carried out correctly in a predetermined position with high precision.

However, a film carrier tape to be used for a BGA, a CSP and a COF has no hole such as the device hole. For this reason, a defective recognition mark cannot be given based on an object to be a simple reference for the alignment.

As described above, it is necessary to correctly carry out the defect marking with high precision in a position specified by a user for each product. In some cases in which there is no simple reference, precision in the position of the defect marking is deteriorated or a marking position is grasped erroneously and the marking is carried out in a different position from the position specified by the user. In some cases, particularly, various products are actually manufactured at the same time and it is necessary to simultaneously correspond to various different specifications for products. Therefore, there is a particularly high possibility that the marking precision might be deteriorated or the marking position might be recognized erroneously.

SUMMARY OF THE INVENTION

It is an object of the present invention to provide a film carrier tape for mounting electronic devices thereon capable of correctly carrying out defect marking in a target position on a mounting unit with high precision, a film carrier tape for mounting electronic devices thereon capable of reducing an error of defect recognition caused by a shift of a defect mark in IC mounting or the like, and a defect marking method of a film carrier tape for mounting electronic devices thereon which can correctly carry out the defect marking in the target position on the mounting unit with high precision.

The present invention provides a film carrier tape for mounting electronic devices thereon having a mounting unit in which a wiring pattern is formed by etching on a base material, wherein the mounting unit has a target mark to be a reference of an alignment for carrying out final defect marking in a target position on the mounting unit by marking means as a pattern formed on the base material by the etching.

In the film carrier tape, it is suitable that the target mark should not be electrically connected to the wiring pattern or should be formed to be clearly indicated by a wiring shape of the wiring pattern. Moreover, it is suitable that the target mark should take an almost identical shape to a marking shape of the marking means. Alternatively, it is suitable that the target mark should be formed in an optional position $A_2$ on a base material which is placed apart from a target position $A_1$ for execution of final defect marking and is not provided with a wiring pattern, and an optional position $A_2'$ on a base material which is not provided with the wiring pattern over a line which is perpendicular to a line connecting the positions $A_1$ and $A_2$ and passes through the position $A_1$ or a position $A_2''$ which is not provided with the wiring pattern on a projection of the position $A_2$ with respect to the position $A_1$.

According to the film carrier tape in accordance with the present invention, the target mark to be the reference of the alignment for carrying out the final defect marking is provided in the target position on the mounting unit by the marking means. Therefore, it is possible to correctly carry out the defect marking in the target position on the mounting unit with high precision.

Moreover, the present invention provides a film carrier tape for mounting electronic devices thereon which has a plurality of mounting units provided with a wiring pattern by etching on a base material and is subjected to a final defect marking step, wherein the mounting units decided to be normal at a quality inspecting step have target marks formed in predetermined positions on the units as a pattern formed by the etching so as to be a reference of an alignment for carrying out final defect marking in target positions on the units by marking means if the units are decided to be defective at the quality inspecting step, and the mounting units decided to be defective at the quality inspecting step have final defect marking carried out in predetermined positions based on the target marks.

According to the film carrier tape in accordance with the present invention, a plurality of mounting units decided to be defective at the quality inspecting step has the final defect marking given with high precision into the predetermined position based on the target mark Therefore, it is possible to reduce an error of defect recognition caused by the shift of the defect mark in IC mounting or the like.

Furthermore, the present invention provides a final defect marking method of a film carrier tape for mounting electronic devices thereon having a mounting unit provided with a wiring pattern by etching on a base material which serves to carry out final marking on the mounting unit decided to be defective at a quality inspecting step, wherein defect marking is carried out in a marking position determined by aligning marking means with the mounting unit based on apposition of a target mark formed as a pattern on the base material by the etching.

According to the defect marking method of the film carrier tape in accordance with the present invention, the defect marking is carried out in the marking position determined by performing the alignment of the marking means and the mounting unit based on the position of the target mark. Therefore, it is possible to correctly execute the defect marking with high precision in the target position on the mounting unit.

It is particularly suitable that each invention should be applied to such a type not having a device hole on a mounting unit.

DETAILED DESCRIPTION OF THE INVENTION

Preferred embodiments of the present invention will be described below with reference to the drawings.

Figure 1:
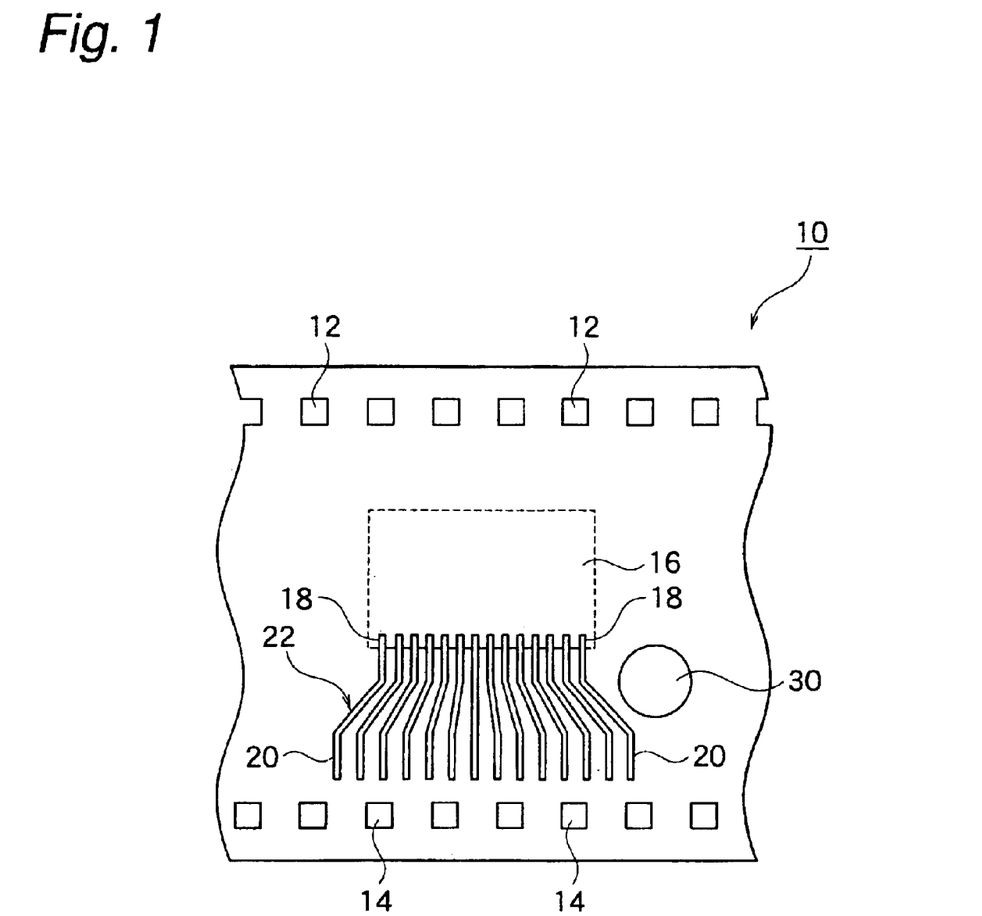
FIG. 1 is a partial top view showing a film carrier tape for mounting electronic devices thereon according to an embodiment of the present invention.
Figure 2:
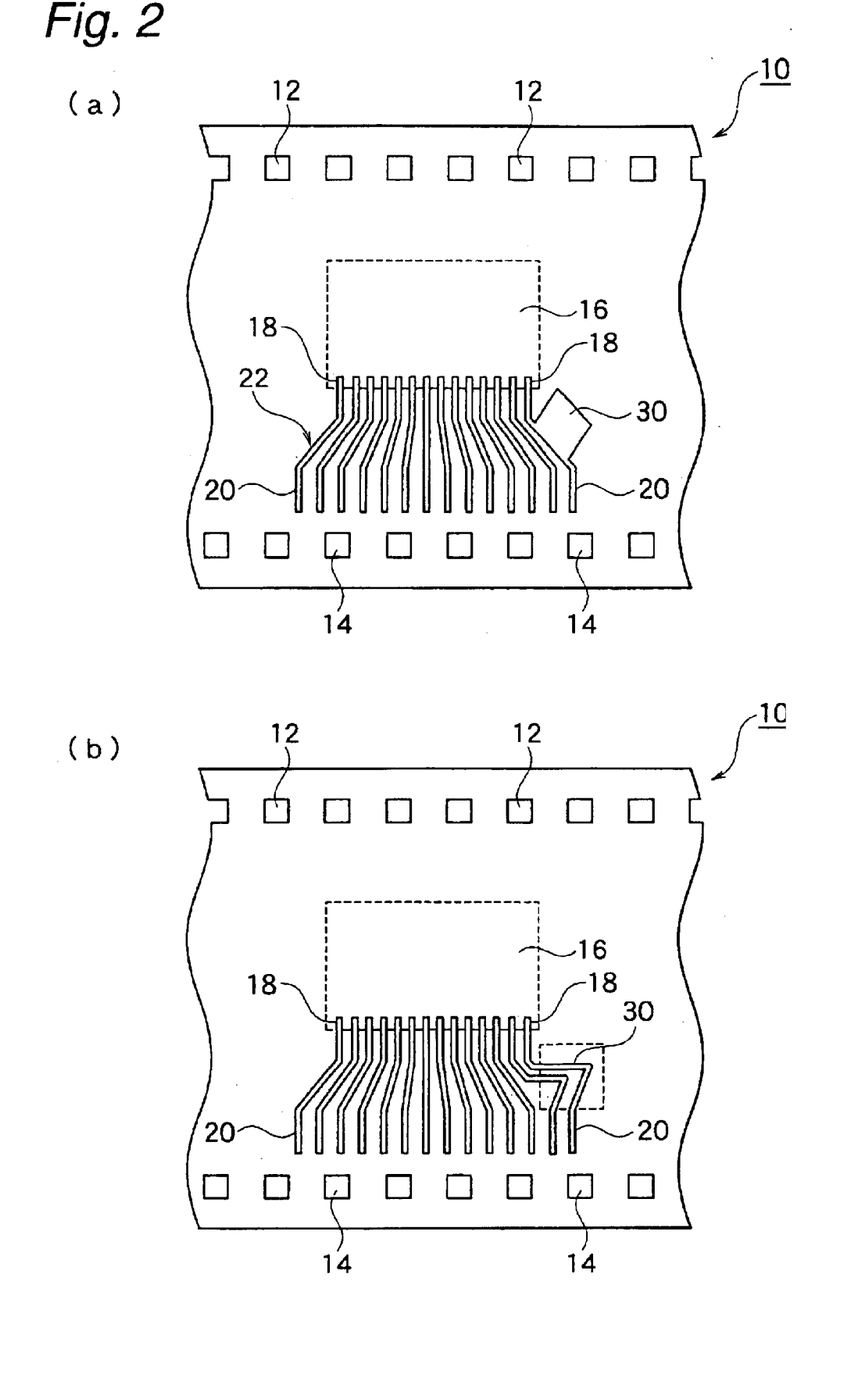
FIG. 2 is a partial top view showing a film carrier tape for mounting electronic devices thereon according to an embodiment of the present invention.
Figure 3:
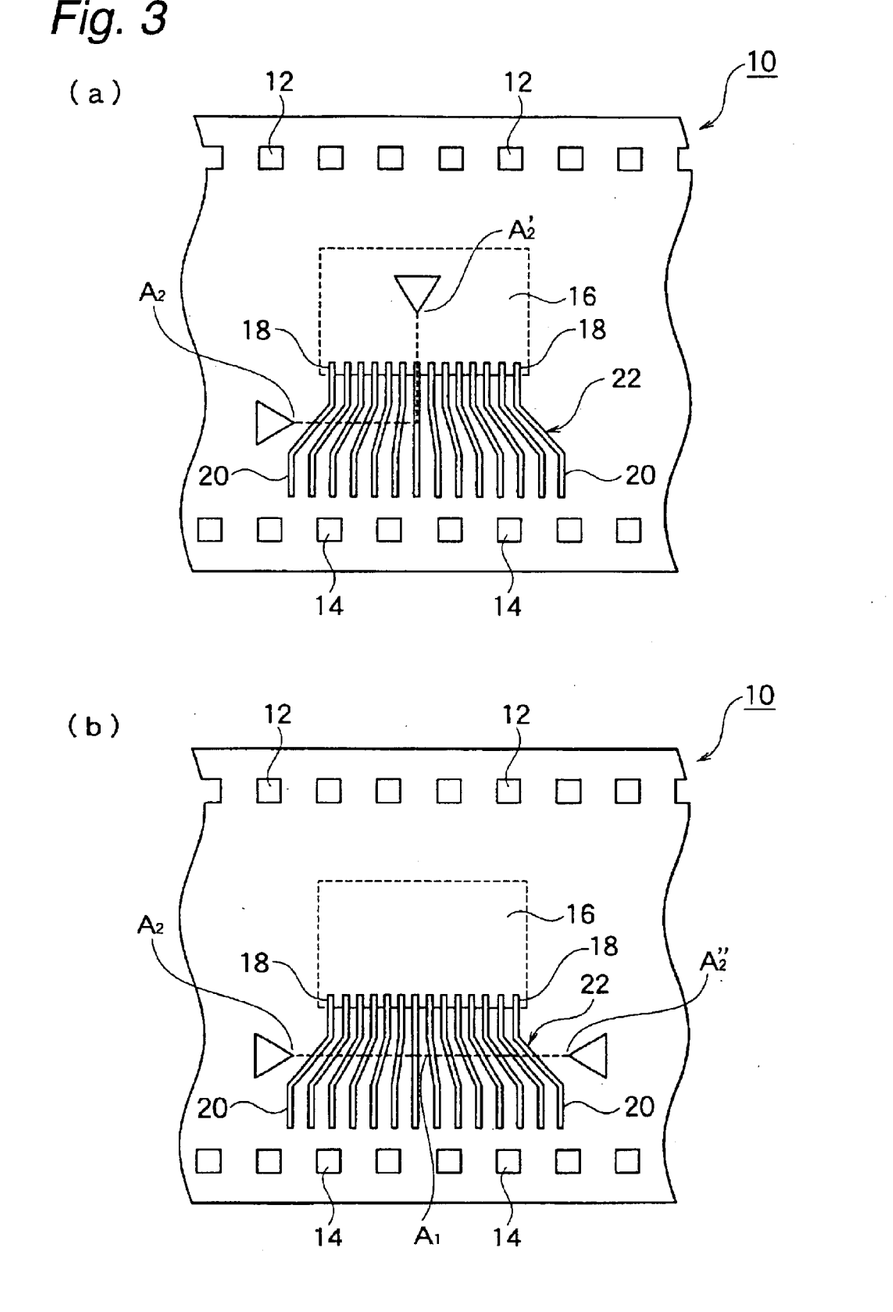
FIG. 3 is a partial top view showing a film carrier tape for mounting electronic devices thereon according to an embodiment of the present invention.
Figure 4:
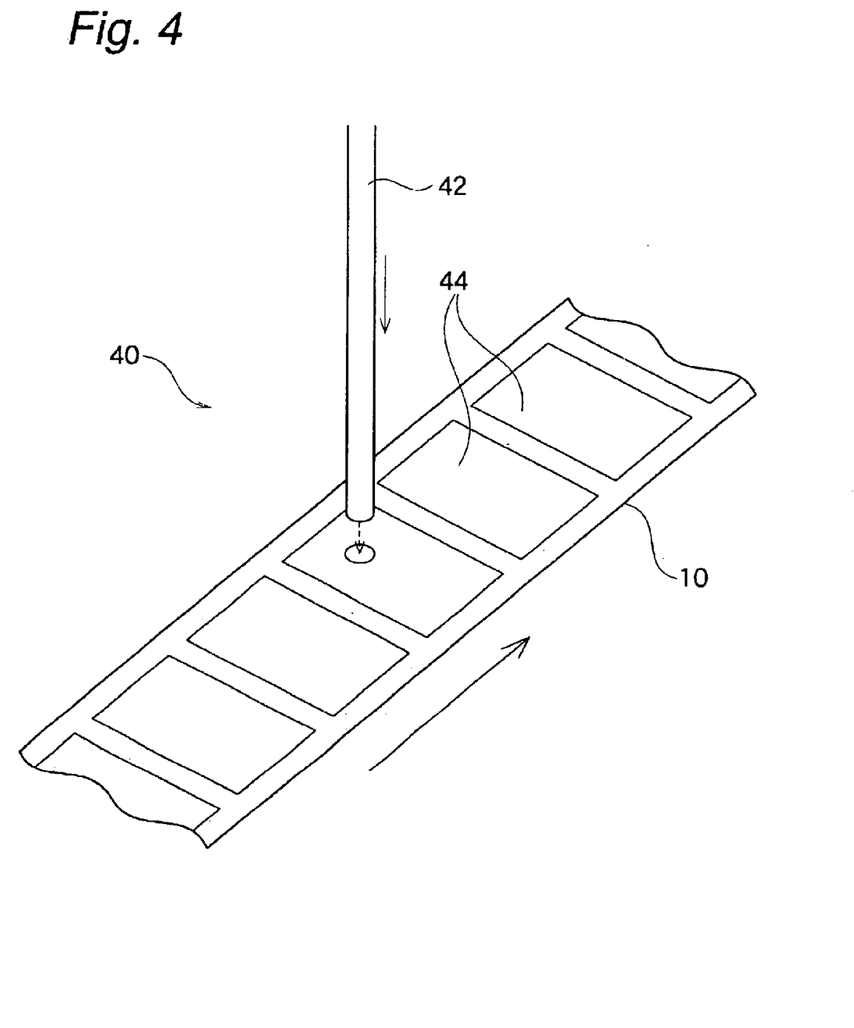
FIG. 4 is a schematic view showing an example of a method of carrying out defect marking by using a film carrier tape for mounting electronic devices thereon according to the present invention.
Figure 5:
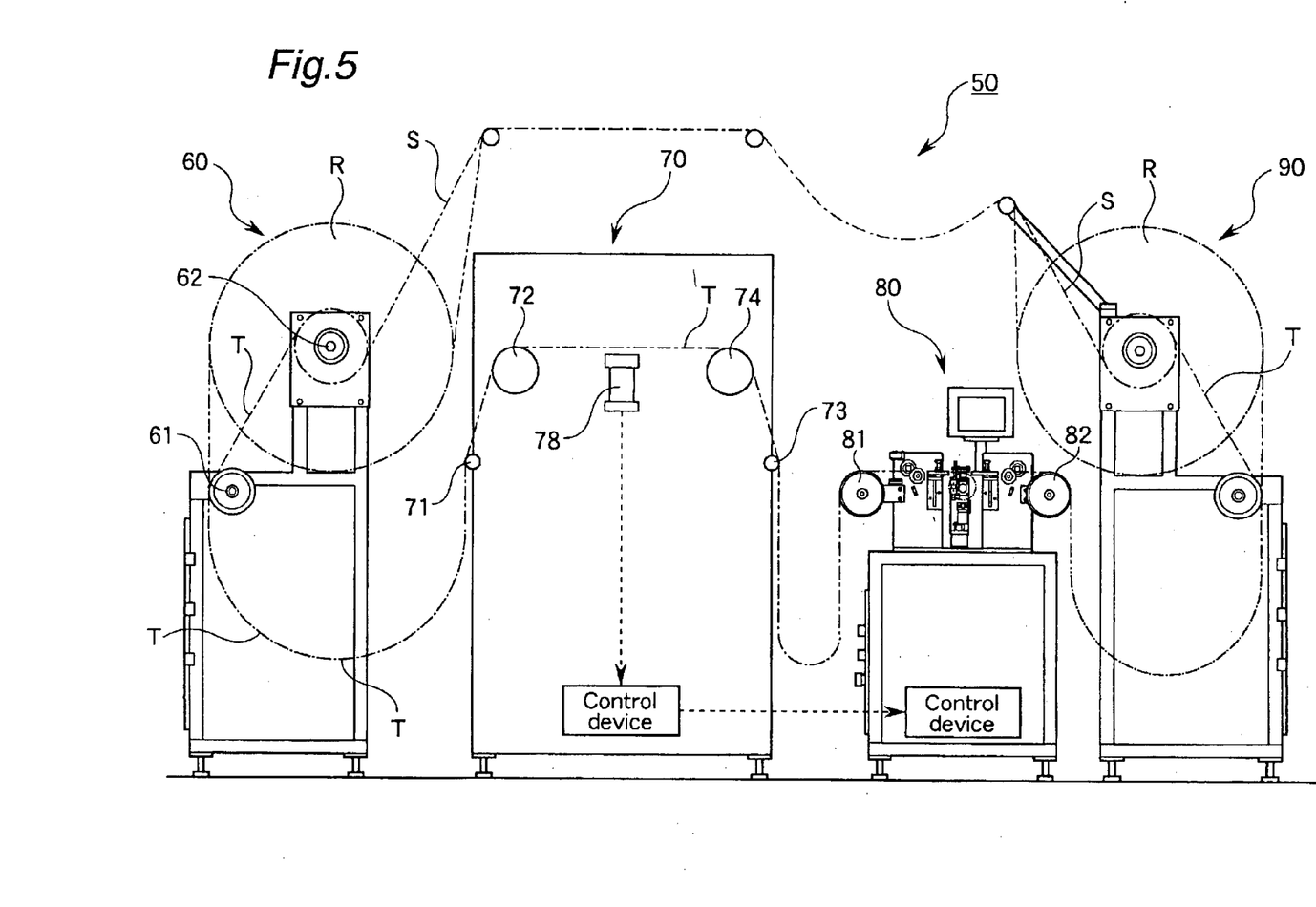
FIG. 5 is a schematic view showing an apparatus for automatically carrying out a quality inspection and defect marking by using a film carrier tape for mounting electronic devices thereon according to the present invention.

FIGS. 1 to 3 are partial top views showing a film carrier tape for mounting electronic devices thereon according to an embodiment of the present invention. FIG. 4 is a schematic view showing an example of a method of carrying out defect marking by using a film carrier tape for mounting electronic devices thereon according to the present invention, and FIG. 5 is a schematic view showing an apparatus for automatically carrying out a quality inspection and defect marking by using a film carrier tape for mounting electronic devices thereon according to the present invention.

A film carrier tape 10 for mounting electronic devices thereon has a plurality of sprocket holes 12 and 14 for conveyance of the tape arranged continuously in a longitudinal direction on both side ends in a transverse direction respectively, and a device such as an IC is mounted to an almost central portion 16 between the sprocket holes 12 and 14. A wiring pattern 22 for connecting an inner lead 18 and an outer lead 20 on a film is formed.

The wiring pattern of the film carrier tape 10 is manufactured in the following manner, for example. First of all, a photoresist is applied onto the surface of a copper foil on a base material film such as a polyimidide film. For the photoresist surface, a portion other than a copper wiring pattern to be formed is exposed and the exposed photoresist is removed. Next, the copper foil in a portion from which the photoresist has been removed is removed by etching, and furthermore, the photoresist is removed so that the copper wiring pattern is formed. Alternatively, a portion of the copper wiring pattern to be formed is exposed and the photoresist which is not exposed is removed from the resist surface depending on the type of the photoresist to be used. Subsequently, the copper foil in a portion from which the photoresist has been removed is removed by the etching, and furthermore, the photoresist is removed so that the copper wiring pattern is formed.

In the present invention, at the step described above, a target mark 30 is formed as a pattern at the same time. The target mark 30 is a reference of an alignment for carrying out final defect marking in a target position on a mounting unit in the film carrier tape 10 by marking means such as the punching member of a punching device or the stamp member of an ink marking device.

More specifically, a manufacturing process such as the formation of a wiring pattern or the like is carried out, and a quality inspection is then performed for a wiring pattern defect on the carrier tape 10 or the like by a human visual inspection or a method of picking up the image of the wiring pattern on the tape by using a CCD camera referred to as a line sensor camera and comparing image pick-up information thus obtained with data on the master pattern of a good product which are prestored, thereby inspecting the defect of the wiring pattern or the like, for example. As a result, a defect mark is given to a mounting unit determined to be defective, thereby carrying out a defect display. The defect marking is performed as schematically shown in FIG. 4, for example. Description will be given to an example in which the alignment and punching is carried out by a person using a punching rod 42 of a punching device as marking means.

In FIG. 4, the film carrier tape 10 having each mounting unit 44 arranged therein is conveyed in a direction of an arrow by the engagement of the sprocket holes formed on both side ends in the transverse direction and a rotating gear which is not shown.

At the quality inspecting step carried out before the defect marking step, when the mounting unit decided to be defective reaches a marking portion 40, the conveyance of the film carrier tape 10 is stopped. The target mark formed on the mounting unit is confirmed visually. By setting the visual confirmation as a standard, the tip portion of the punching rod 42 is aligned with a target position on the mounting unit to be punched.

The alignment can be carried out by moving the punching rod 42 in the longitudinal or transverse direction of the carrier tape 10 through proper regulating means, for example.

After the alignment is thus carried out, the punching rod 42 is brought down in a perpendicular direction to the target position on the mounting unit, thereby carrying out the punching.

Thus, a target mark given clearly as the reference of the alignment is formed as a pattern on each mounting unit. Therefore, it is possible to correctly carry out the defect marking in the target position with high precision.

With reference to FIG. 4, the description has been given to the example in which the alignment and the punching are carried out by a person using the punching member (the punching rod) of the punching device as the marking means, and the present invention is not restricted thereto. By using the stamp member of the ink marking device as the marking means, for example, the defect display may be carried out by the execution of ink marking in the target position on the mounting unit. Moreover, the defect marking may be carried out mechanically and automatically together with the quality inspecting step, for example. In this case a first alignment can be carried out by a person, and then, the quality inspection and the defect marking can be performed automatically.

By taking an inspecting apparatus 50 of FIG. 5 as an example, description will be given to the case in which the defect marking is automatically carried out together with the quality inspecting step.

In FIG. 5, the inspecting apparatus 50 for a film carrier tape for mounting electronic devices thereon comprises a feeding device 60, a defective pattern detecting device 70, a marking device 80 and a winding device 90.

In the feeding device 60, a reel R upon which a film carrier tape T completely subjected to the manufacturing process is wound through a spacer S is attached to a feed driving shaft 62. By the driving operation of a driving motor which is not shown, then, the feed driving shaft 62 is rotated and the tape T is reeled out of the reel R together with the spacer S and is supplied to the defective pattern detecting device 70 through a guide roller 61.

When the tape T supplied to the defective pattern detecting device 70 passes between a back tension gear 72 and a drive gear 74 which are provided in the defective pattern detecting device 70 through a guide roller 71, the driving operation of the drive gear 74 is temporarily stopped so that the feed of the tape T is stopped and the tape T is accurately placed in a predetermined position by the reverse rotation of the back tension gear 72 to be engaged with the sprocket hole of the tape T. In this state, the wiring pattern of a lead recognized by a CCD camera 78 is input to a control device in the defective pattern detecting device 70 and is compared with a normal wiring pattern which is previously input to a storage portion such as an RAM in the control device. If the wiring pattern is decided to be defective, the position of a defective portion is output to the control device of the marking device 80 which will be described below.

On the other hand, the tape T over which the defect of the wiring pattern is inspected by the defective pattern detecting device 70 is subsequently supplied to the marking device 80 through guide rollers 73 and 81. While the tape T supplied to the marking device. 80 passes from the guide roller 81 to a guide roller 82, then, marking is carried out over a defect mounting unit detected by the defective pattern detecting device 70 through an ink based on detection information about the same unit.

In this case, the position of the tip of the stamp member in the marking device 80 is previously aligned with the target position on the mounting unit. At this time, the target mark formed on the mounting unit is first confirmed visually and the alignment is carried out by setting the visual confirmation as a standard, and an automatic optical inspection and automatic marking are subsequently performed based on the determined alignment.

In the present invention, thus, each mounting unit of the film carrier tape has the target mark. Therefore, it is possible to correctly carry out defect marking in the target position with high precision. While the target mark is formed circularly in FIG. 1, the shape of the mark is not particularly restricted but any shape such as a triangle or a square may be employed. Moreover, the mark may be numerals, alphabet, Chinese characters, symbols or the like. In respect of the easiness of a visual decision, furthermore, it is preferable that the size of the target mark should have an area of approximately 0.1 mm$^2$ to 12.5 mm$^2$.

For the manner of the target mark, for example, the pattern of the target mark is not electrically connected to the wiring pattern as shown in FIG. 1, and furthermore, the target mark may be formed by the wiring shape of the wiring pattern as clearly shown in FIG. 2. Mote specifically, as shown in FIG. 2(a), the target mark can also be formed depending on a displacement of the width of the wiring pattern, for example, the width of the wiring pattern is partially increased to clearly indicate the target mark.

As shown in FIG. 2(b), moreover, the target mark can also be formed by a displacement of the bending of the wiring pattern, for example, the wiring pattern is partially bent to clearly indicate the target mark.

In the case in which the target mark is to be clearly indicated by the wiring shape of the wiring pattern, thus, it is preferable that the area of a region clearly indicated as the width of the wiring pattern or the displacement of the bending should be approximately 0.1 mm$^2$ to 5 mm$^2$ in respect of the easiness of the visual decision.

In some cases, moreover, the target position in which the defect marking is to be carried out partially or wholly overlaps with the wiring pattern. In these cases, as shown in FIG. 3, a plurality of target marks is provided on a substrate having no wiring pattern and the target position can also be defined indirectly based on the target marks.

In FIG. 3(a), the target mark is formed in an optional position $A_2$ on a base material which is placed apart from a target position $A_1$ for the execution of final defect marking and is not provided with a wiring pattern, and an optional position $A_2'$ on a base material which is not provided with the wiring pattern over a line which is perpendicular to a line connecting the positions $A_1$ and $A_2$ and passes through the position $A_1$, and the target position is defined visually on an orthogonal point of a line passing through the position $A_2$ and a line passing through the position $A_2'$.

In FIG. 3(b), the target mark is formed in an optional position $A_2$ on a base material which is placed apart from a target position $A_1$ for the execution of final defect marking and is not provided with a wiring pattern, and an optional position $A_2''$ on a base material which is, not provided with the wiring pattern over a projection of the position $A_2$ with respect to the position $A_1$, and the target position is visually defined on a middle point of the positions $A_2$ and $A_2''$.

Moreover, it is suitable that the target mark should take almost the same shape as the marking shape of the marking means (such as a perforation by use of punching member of the punching device and an ink mark by use of the stamp member of the ink marking device). The defect marking can be carried out in the target position with high precision.

In these manners, the defect marking can be carried out in the target position with high precision even if the film carrier tape provided with the target mark does not have the device hole. Consequently, it is particularly suitable that the present invention should be applied to a film carrier tape for mounting electronic devices thereon of such a type not having the device hole, for example, a COF tape. However, the present invention is not restricted thereto but can also be applied to a film carrier tape for mounting electronic devices thereon of such a type having the device hole.

Thus, the defect marking is carried out over all the defective units arranged on the film carrier tape, and they are then wound upon a reel and are shipped in this condition. In the film carrier tape according to the present invention which has been subjected to the defect marking based on the target mark, the defect mark is given into the target position with high precision. In the IC mounting, consequently, it is possible to reduce an error of defect recognition caused by the shift of the defect mark.

According to the film carrier tape in accordance with the present invention, the target mark to be the reference of the alignment for carrying out the final defect marking is provided in the target position on the mounting unit by the marking means. Therefore, it is possible to correctly carry out the defect marking in the target position on the mounting unit with high precision.

According to the film carrier tape in accordance with the present invention, moreover, a plurality of mounting units determined to be defective at the quality inspecting step has the final defect marking carried out with high precision in the target position based on the target mark. Therefore, it is impossible to reduce an error of defect recognition caused by the shift of the defect mark in IC mounting or the like.

According to the defect marking method of the film carrier tape in accordance with the present invention, furthermore, the defect marking is carried out in the marking position determined by carrying out the alignment of the marking means and the mounting unit based on the position of the target mark. Therefore, it is possible to correctly perform the defect marking with high precision in the target position on the mounting unit.

EXAMPLE

A COF tape, provided with a target mark together with a copper wiring pattern by etching was manufactured as an example. By using the COF tape according to the example, a quality inspection and defect marking were carried out by an inspector.

Moreover, a COF tape which is not provided with the target mark was manufactured as a comparative example. By using the COF tape according to the comparative example, the quality inspection and the defect marking were carried out by the inspector.

Referring to the COF tapes according to the example and the comparative example, an error of defect recognition caused by a shift of a mark were compared with each other in the recognition of a defect mark before IC mounting. As a result, it was confirmed that a fraction of the defect recognition error is approximately 10% in the comparative example and is considerably decreased to be approximately 0.1% in the example.

What is claimed is:

1. A film carrier tape for mounting electronic devices thereon having a mounting unit in which a wiring pattern is formed by etching on a base material,
    wherein the mounting unit has a target mark to be a reference of an alignment for carrying out final defect marking in a target position on the mounting unit by marking means as a pattern formed on the base material by the etching.

2. The film carrier tape for mounting electronic devices thereon according to claim 1, wherein the target mark is not electrically connected to the wiring pattern.

3. The film carrier tape for mounting electronic devices thereon according to claim 1, wherein the target mark is formed to be clearly indicated by a wiring shape of the wiring pattern.

4. The film carrier tape for mounting electronic devices thereon according to claim 1, wherein the target mark takes an almost identical shape to a marking shape of the marking means.

5. The film carrier tape for mounting electronic devices thereon according to claim 1, wherein the target mark is formed in an optional position $A_2$ on a base material which is placed apart from a target position $A_1$ for execution of final defect marking and is not provided with a wiring pattern, and
    an optional position $A_2'$ on a base material which is not provided with the wiring pattern over a line which is perpendicular to a line connecting the positions $A_1$ and $A_2$ and passes through the position $A_1$ or a position $A_2''$ which is not provided with the wiring pattern on a projection of the position $A_2$ with respect to the position $A_1$.

6. The film carrier tape for mounting electronic devices thereon according to claim 1, wherein the mounting unit does not have a device hole.

7. A film carrier tape for mounting electronic devices thereon which has a plurality of mounting units provided with a wiring pattern by etching on a base material and is subjected to a final defect marking step,
    wherein the mounting units decided to be normal at a quality inspecting step have target marks formed in predetermined positions on the units as a pattern formed by the etching so as to be a reference of an alignment for carrying out final defect marking in target positions on the units by marking means if the units are decided to be defective at the quality inspecting step, and
    the mounting units decided to be defective at the quality inspecting step have final defect marking carried out in predetermined positions based on the target marks.

8. The film carrier tape for mounting electronic devices thereon according to claim 7, wherein the mounting unit does not have a device hole.

9. A final defect marking method of a film carrier tape for mounting electronic devices thereon having a mounting unit provided with a wiring pattern by etching on a base material which serves to carry out final marking on the mounting unit decided to be defective at a quality inspecting step,
    wherein defect marking is carried out in a marking position determined by aligning marking means with the mounting unit based on a position of a target mark formed as a pattern on the base material by the etching.

10. The final defect marking method of a film carrier tape for mounting electronic devices thereon according to claim 9, wherein the mounting unit does not have a device hole.

11. The film carrier tape for mounting electronic devices thereon according to claim 2, wherein the target mark takes an almost identical shape to a marking shape of the marking means.

12. The film carrier tape for mounting electronic devices thereon according to claim 3, wherein the target mark takes an almost identical shape to a marking shape of the marking means.

13. The film carrier tape for mounting electronic devices thereon according to claim 2, wherein the mounting unit does not have a device hole.

14. The film carrier tape for mounting electronic devices thereon according to claim 3, wherein the mounting unit does not have a device hole.

15. The film carrier tape for mounting electronic devices thereon according to claim 4, wherein the mounting unit does not have a device hole.

16. The film carrier tape for mounting electronic devices thereon according to claim 5, wherein the mounting unit does not have a device hole.

* * * * *